United States Patent
Kuo

[11] Patent Number: 6,043,116
[45] Date of Patent: Mar. 28, 2000

[54] METHOD OF FABRICATING SELF-ALIGN-CONTACT

[75] Inventor: Chien-Li Kuo, Hsinchu Hsien, Taiwan

[73] Assignee: United Microelectronics Corp., Hsinchu, Taiwan

[21] Appl. No.: 09/093,984

[22] Filed: Jun. 9, 1998

[30] Foreign Application Priority Data

Mar. 4, 1998 [TW] Taiwan .................................. 87103108

[51] Int. Cl.[7] ...................... H01L 21/8238; H01L 21/336
[52] U.S. Cl. ............................ 438/233; 438/303; 438/595
[58] Field of Search .................................. 438/229–233, 438/241–242, 299–307, 585–596

[56] References Cited

U.S. PATENT DOCUMENTS

| | | | |
|---|---|---|---|
| 5,073,510 | 12/1991 | Kwon et al. ........................... | 438/303 |
| 5,620,919 | 4/1997 | Godinho et al. ....................... | 438/230 |
| 5,683,922 | 11/1997 | Jeng et al. ............................. | 438/299 |
| 5,728,595 | 3/1998 | Fukase .................................. | 438/241 |
| 5,877,081 | 3/1999 | Matsumoto et al. ................... | 438/624 |
| 5,885,895 | 3/1999 | Liu et al. .............................. | 438/637 |

*Primary Examiner*—Charles Bowers
*Assistant Examiner*—Thanh Nguyen
*Attorney, Agent, or Firm*—Thomas, Kayden, Horstemeyer & Risley

[57] ABSTRACT

A method of fabricating a self-align-contact is provided. Two gates are formed on a semiconductor substrate. A first spacer is formed on the sidewalls of the two gates, and a source/drain region is formed between the two gates. A first dielectric layer and a second dielectric layer are formed on the semiconductor substrate. The second dielectric layer is patterned. A self-align-contact opening is formed between the two gates by removing the first dielectric layer and the first spacer using the second dielectric layer as a mask. A second spacer is formed on the exposed sidewalls of the gate. The method of forming the second spacer includes forming an insulating layer that is about 200–100 Å thick and anisotropically etching the insulating layer. The width of the second spacer is narrower than the width of the first spacer. A conductor layer is formed in the self-align-contact opening.

22 Claims, 6 Drawing Sheets

METHOD OF FABRICATING SELF-ALIGN-CONTACT

CROSS-REFERENCE TO RELATED APPLICATION

This application claims the priority benefit of Taiwan application Ser. no. 87103108, filed Mar. 4, 1998, the full disclosure of which is incorporated herein by reference.

BACKGROUND OF THE INVENTION

1. Field of the Invention

The invention relates in general to the method of fabricating a semiconductor device, and more particularly to the method of fabricating a self-align-contact with low resistance.

2. Description of the Related Art

In the semiconductor process there are many methods of fabricating a self-align-contact. One of conventional methods of forming a self-align-contact includes first providing a substrate on which there are at least two MOS devices and then forming an insulating layer, such as silicon oxide, on the two MOS devices. Each of the two MOS devices includes a polysilicon gate and spacers on the sidewalls of the gate. The two MOS devices have a common source/drain region located between the gates of the two MOS devices. The insulating layer is patterned to form a contact opening to expose the common source/drain region. A conductive layer is deposited in the self-align-contact opening to form a self-align-contact.

A process flow showing the formation of a conventional self-align-contact is illustrated by FIG. 1A–1D. Referring to FIG. 1A, a gate 102 and source/drain regions 110 are formed on a semiconductor substrate 100. The gate 102 includes a gate oxide 104, a doped polysilicon layer 106 and a cap layer 108. The cap layer 108 is formed on the doped polysilicon layer 106 to protect the doped polysilicon layer 106. A spacer 112 is formed on the sidewalls of the gate 102. The source/drain regions 110 are lightly doped drain (LDD) structures. The method of forming the source/drain regions 110 includes lightly implanting ions to the semiconductor substrate 100 using the gate 102 as a mask and heavily implanting ions to the semiconductor substrate 100 using the spacer 112 as a mask. Referring to FIG. 1B, a dielectric layer 114 is formed on the semiconductor substrate 100 by CVD.

Next, referring to FIG. 1C, the dielectric layer 114 is patterned by both a lithography process and etching to form a contact opening 117 located between two gates 102. This exposes the source/drain region 110.

Next, referring to FIG. 1D, a conductive layer 118, such as doped polysilicon, is formed in the contact opening 117 and on the semiconductor substrate 100 by deposition. The conductive layer 118 is patterned. A self-align-contact according to prior art is accomplished.

However, the above conventional method of forming a self-align-contact includes many drawbacks. Referring to FIG. 2, the width d of the spacer 112 is about 0.1 $\mu$m for forming the source/drain region 110 that is a lightly doped drain (LDD) structure. When the integration of semiconductor devices increases, the space s between two gates 102 shrinks to 0.3 $\mu$m or less. Therefore, the exposed area of the source/drain regions 110 decreases. When anisotropic etching is performed to form the spacer 112, the space between two gates 102 is sometimes too small to form the spacer 112. If the relation between d and s is $2d \geq s$, the situation is even worse than not having any exposed remainder of the source/drain regions 110 because the adjacent spacers connect. The result of this is device failure due to the inability of the self-align-contact to form successfully.

SUMMARY OF THE INVENTION

It is an object of the invention to provide a method of fabricating a self-align-contact that includes a spacer with narrow width to increase the contact area of the self-align-contact.

It is another object of the invention to provide a simple method of fabricating a self-align-contact to reduce the resistance of the self-align-contact and to provide good ohmic contact ability of the self-align-contact.

It is another object of the invention to provide a method of fabricating a self-align-contact to match the needs of current high integration of semiconductor devices.

It is another object of the invention to provide a method of fabricating a self-align-contact that includes a spacer with narrow width to eliminate connection of the adjacent spacers.

A method of fabricating a self-align-contact is provided. Two gates are formed on a semiconductor substrate. A first spacer is formed on the sidewalls of the two gates, and a source/drain region is formed between the two gates. A first dielectric layer and a second dielectric layer are formed on the semiconductor substrate. The second dielectric layer is patterned. A self-align-contact opening is formed between the two gates by removing the first dielectric layer and the first spacer using the second dielectric layer as a mask. A second spacer is formed on the exposed sidewalls of the gate. The method of forming the second spacer includes forming an insulating layer that is 200–300 Å thick and anisotropically etching the insulating layer. The width of the second spacer is narrower than the width of the first spacer. A conductive layer is formed in the selfalign-contact opening.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The method of the invention is to form a self-align-contact with low resistance and the ability to make good ohmic contact by forming a spacer with narrow width.

Figure 1A:
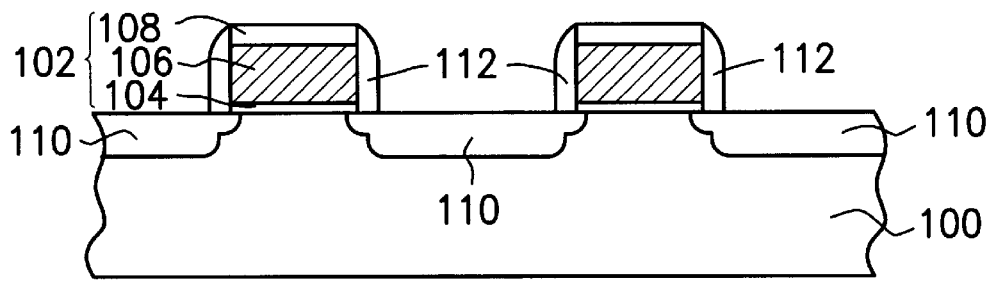
FIG.1A to 1D are cross-sectional views showing a conventional process flow of fabricating a self-align-contact.
Figure 1B:
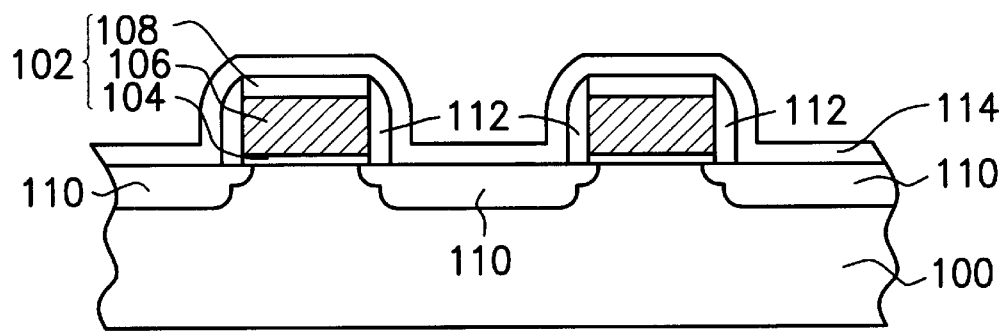
Figure 1C:
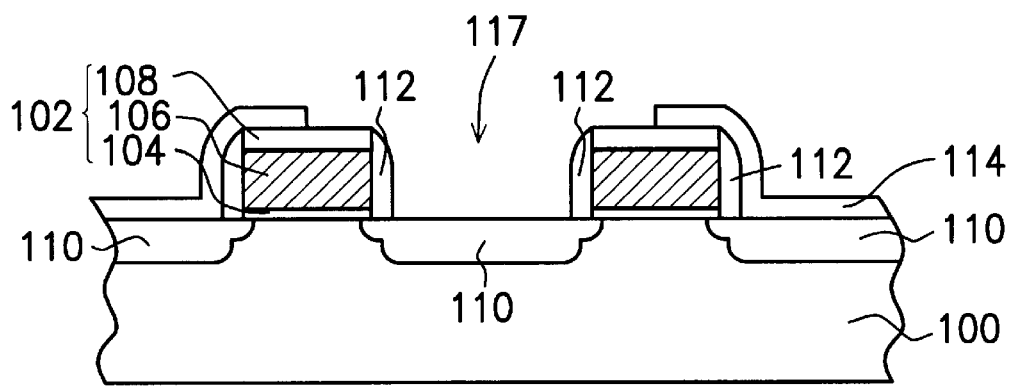
Figure 1D:
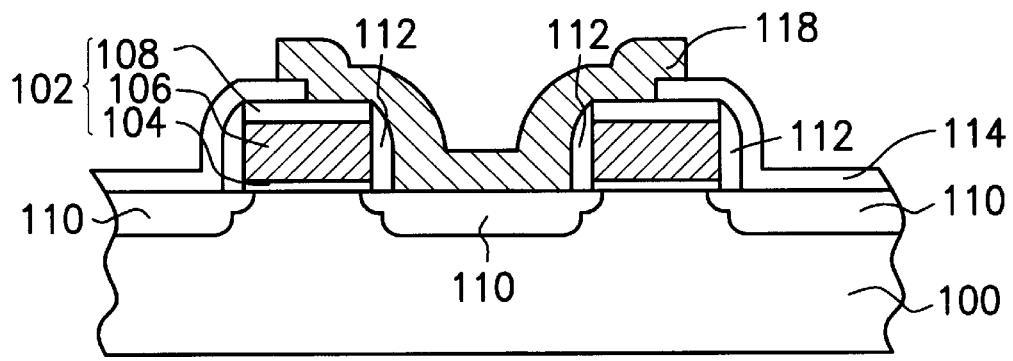
Figure 2:
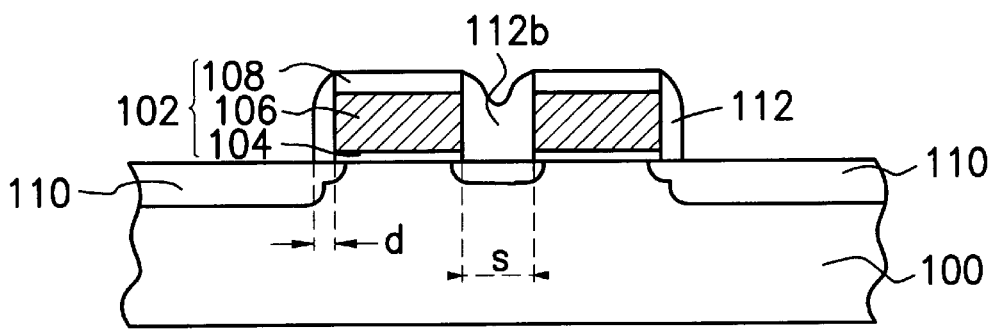
FIG. 2 is a cross-sectional view showing a conventional self-align-contact structure with spacers' connecting.
Figure 3A:
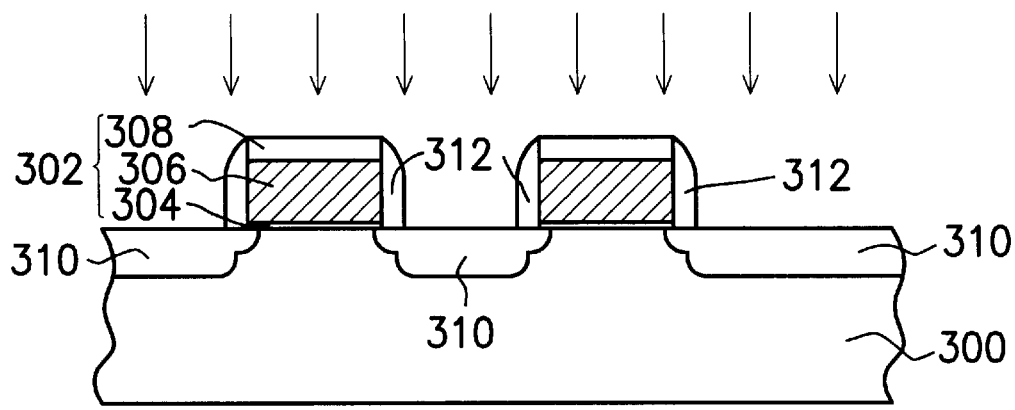
FIGS. 3A to 3F are cross-sectional views showing a process flow of fabricating a self-align-contact according to the invention.

FIGS. 3A to 3F are cross-sectional views showing a process flow of fabricating a self-align-contact of the invention. Referring to FIG. 3A, a gate 302 and source/drain regions 310 are formed on a semiconductor substrate 300. The semiconductor substrate 300 is a lightly doped P-type semiconductor substrate or a lightly doped P-type well. The gate 302 includes a gate oxide 304, a conductive doped polysilicon layer 306 and a cap layer 308. The method of forming the gate oxide 304 includes oxidizing the semiconductor substrate 300 at a temperature of 800–1000° C. The gate oxide 304 is 30–200 Å thick. The conductive layer 306 includes a doped polysilicon layer and a metal silicide layer. The doped polysilicon layer is formed to a thickness of 1000–3000 Å by low-pressure chemical vapor deposition (LPCVD). The doped polysilicon layer is formed by depositing a polysilicon layer, implanting phosphorus or arsenic ions to the polysilicon layer and annealing the polysilicon layer. The implanting step can be performed either with the depositing step or after the depositing step. The metal silicide layer includes $Wsi_2$, $TiSi_2$, and $MoSi_2$. The metal silicide layer is about 1000–3000 Å thick. The cap layer 308 is formed on the conductive layer 306 to protect the conductive layer 306. The cap layer 308 includes silicon oxide or silicon nitride by chemical vapor deposition (CVD). The cap layer 308 is about 1500–2000 Å thick. A spacer 312 is formed on the sidewalls of the gate 302. The spacer 312 is formed by depositing an insulating layer on the semiconductor substrate 300 and by anisotropically etching back the insulating layer.

The source/drain regions 310 are lightly doped drain (LDD) structures. The method of forming the source/drain regions 310 includes lightly implanting ions, such as phosphorus or arsenic ions, in the semiconductor substrate 300 using the gate 302 as a mask and heavily implanting ions in the semiconductor substrate 300 using the spacer 312 as a mask. The preferred energy of the light implantation is about 40–80 KeV and the preferred dosage of the light implantation is about $5\times10^{12}$–$5\times10^{14}$ ions/cm$^2$. The preferred energy of the heavy implantation is about 50–80 KeV and the preferred dosage of the heavy implantation is about $1\times10^{15}$–$8\times10^{15}$ ions/cm$^2$.

Figure 3B:
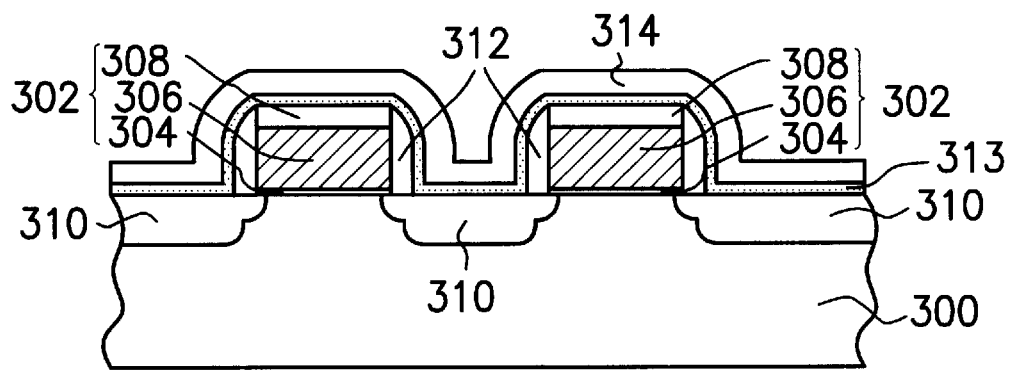

Referring to FIG. 3B, a dielectric layer 313 is formed on the gate 302, the source/drain regions 310 and the spacer 312. Additionally, a dielectric layer 314 is formed on the dielectric layer 313. The dielectric layer 313 is about 200–300 Å thick. The etching rate of the dielectric layer 313 and the etching rate of the dielectric layer 314 are different, while the etching rate of the dielectric layer 313 and the etching rate of the cap layer 308 are same. For example, the dielectric layer 313 can be silicon oxide and the dielectric layer 314 can be silicon nitride or the dielectric layer 313 can be silicon nitride and the dielectric layer 314 can be silicon oxide. In addition, the thickness of the dielectric layer 313 is less than the thickness of the dielectric layer 314.

Figure 3C:
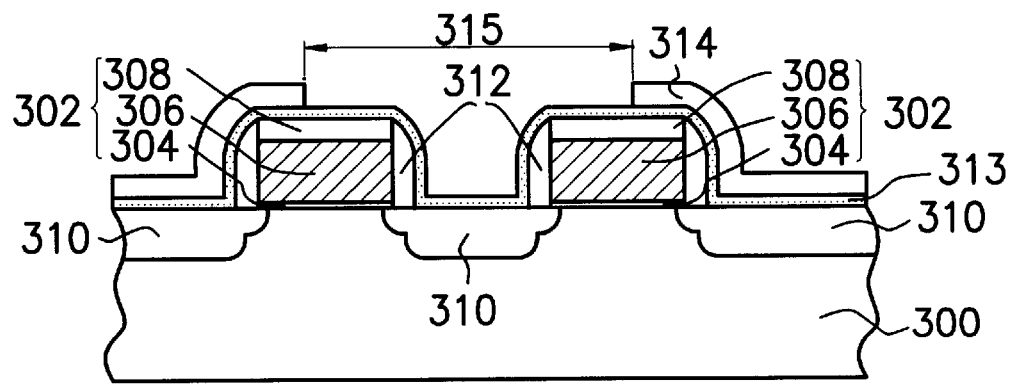

Referring to FIG. 3C, the dielectric layer 314 is patterned by lithography and an anisotropic etching process using the dielectric layer 313 as an etching stop layer to form an opening 315 which corresponds to the source/drain regions 310.

Figure 3D:
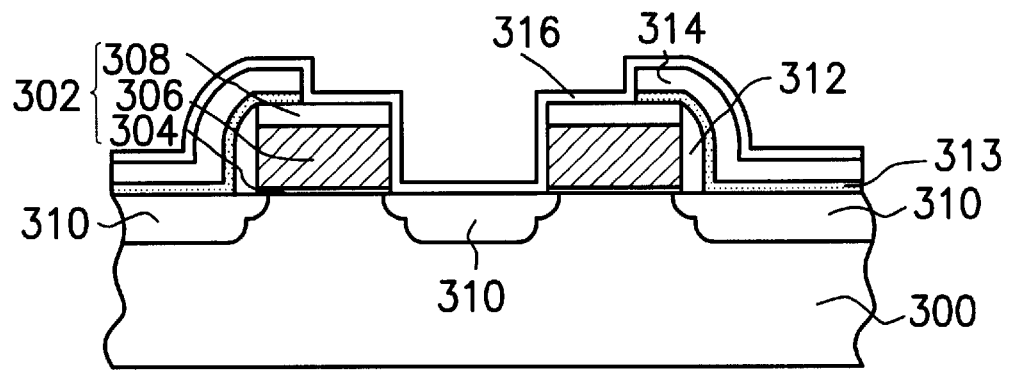

Referring next to FIG. 3D, the dielectric layer 313 is patterned by anisotropic etching using the dielectric layer 314 as a mask to expose the source/drain region 310. The spacer 312 between two gates 302 is removed by etching. A dielectric layer 316 is formed on the dielectric layer 314 and the source/drain region 310 between the two gates 302 by chemical vapor deposition (CVD). The dielectric layer 316 includes silicon oxide or silicon nitride and is about 200–300 Å thick.

Figure 3E:
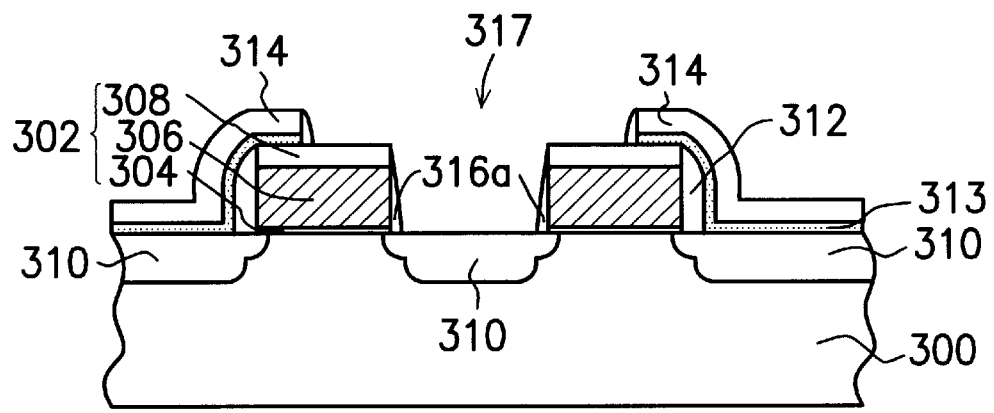

Referring next to FIG. 3E, an anisotropic etching is performed on the dielectric layer 316 to form a spacer 316a on the sidewalls of the gates 302 and to form a self-align-contact opening 317 located between two gates 302. Because the thickness of the dielectric layer 316 is very thin, the width of the spacer 316a is narrower than the width of the spacer 312. Therefore, the exposed area of the source/drain regions 310 between two gates 302 increases. The contact area of the self-align-contact with the source/drain regions 310 also increases.

Figure 3F:
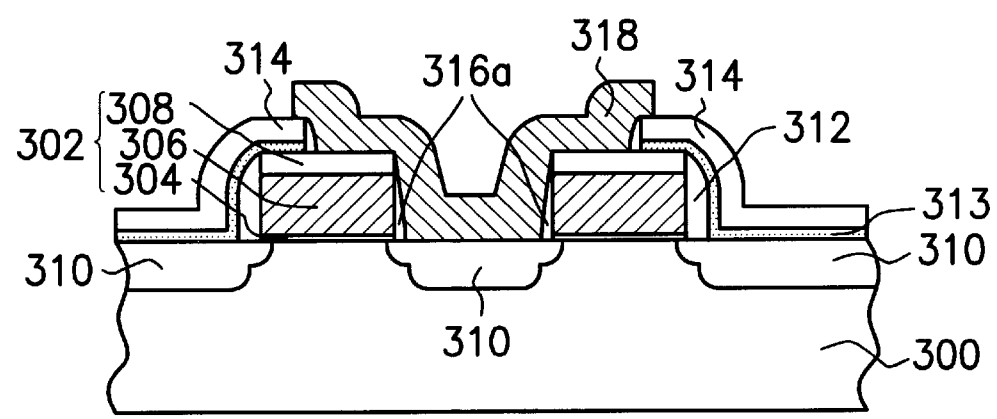

Referring next to FIG. 3F, a conductive layer 318 is formed to a thickness of about 1000–3000 Å. The conductive layer 318 is formed by depositing a polysilicon layer, implanting phosphorus or arsenic ions into the polysilicon layer and annealing the polysilicon layer. The implanting step is performed either with or after the depositing step. The conductive layer 318 is patterned by lithography and an etching process. A self-align-contact of the invention is accomplished.

Figure 4A:
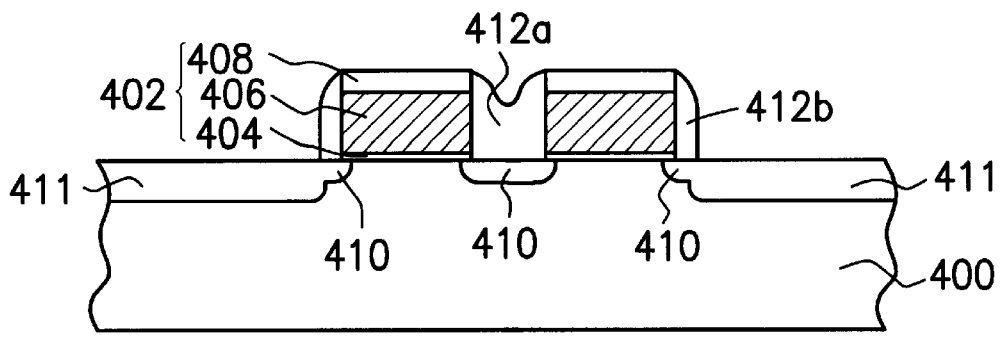
FIGS. 4A to 4F are other cross-sectional views showing a process flow of fabricating a self-align-contact according to the invention.

FIGS. 4A to 4F are another set of cross-sectional views showing a process flow of fabricating a self-align-contact of the invention. Referring to FIG. 4A, a gate 402 and source/drain regions 410 are formed on a semiconductor substrate 400. The gate 402 includes a gate oxide 404, a conductive doped polysilicon layer 406 and a cap layer 408. The gate oxide 404 is about 30–200 Å thick. The conductive layer 406 includes a doped polysilicon layer and a metal silicide layer. The doped polysilicon layer is formed by depositing a polysilicon layer, implanting phosphorus or arsenic ions to the polysilicon layer and annealing the polysilicon layer. The cap layer 408 is about 1500–2000 Å thick. A spacer 412a and a spacer 412b are formed on the sidewalls of the gate 402. Because of the increase in the integration of MOS devices, the spacers 412a between the gates 402 connect and there is no exposed area on the source/drain region 410 between the gates 402.

Figure 4B:
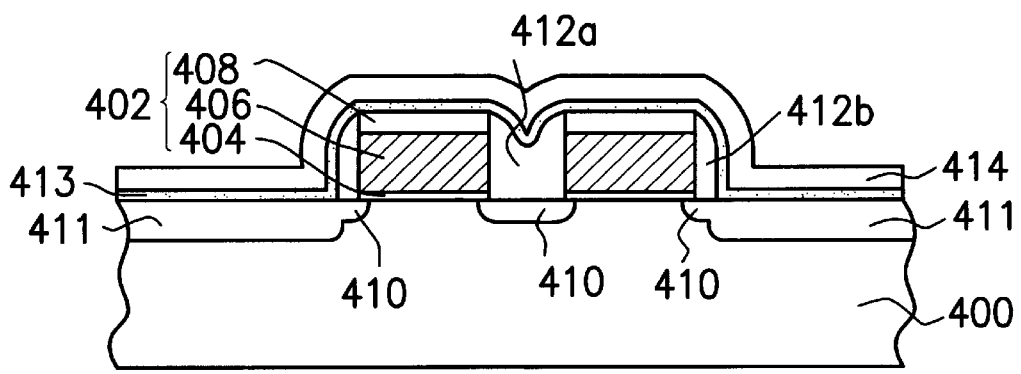

Referring to FIG. 4B, a dielectric layer 413 is formed on the gate 402, the source/drain regions 410 and the spacer 412. Additionally, a dielectric layer 414 is formed on the dielectric layer 413. The dielectric layer 413 is about 200–300 Å thick. The etching rate of the dielectric layer 413 and the etching rate of the dielectric layer 414 are different. The etching rate of the dielectric layer 413 and the etching rate of the cap layer 408 are different, while the etching rate of the dielectric layer 413 and the etching rate of the spacer 412 are same. For example, the dielectric layer 413 can be silicon oxide and the dielectric layer 414 can be silicon nitride. The cap layer can be silicon nitride and the spacer can be silicon oxide. Or the dielectric layer 413 can be silicon nitride and the dielectric layer 414 can be silicon oxide. In addition, the thickness of the dielectric layer 413 is less than the thickness of the dielectric layer 414.

Figure 4C:
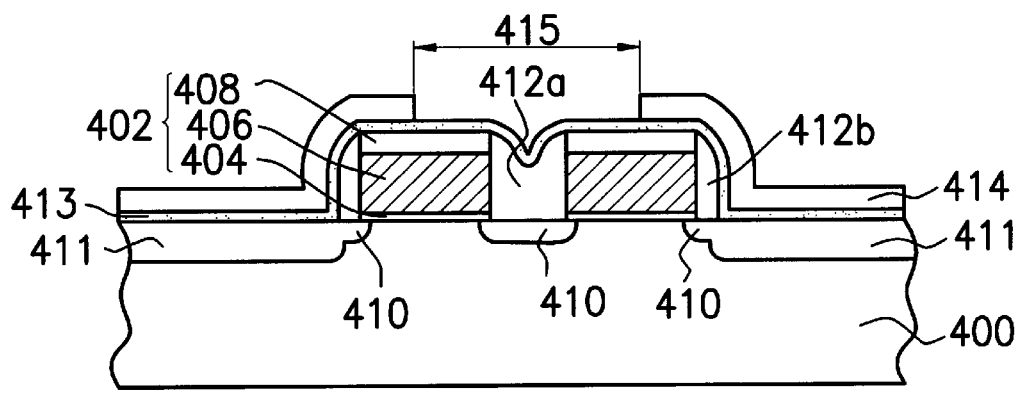

Referring to FIG. 4C, the dielectric layer 414 is patterned by a lithography process and anisotropic etching, using the dielectric layer 413 as an etching stop layer, to form an opening 415 which corresponds to the source/drain regions 410.

Figure 4D:
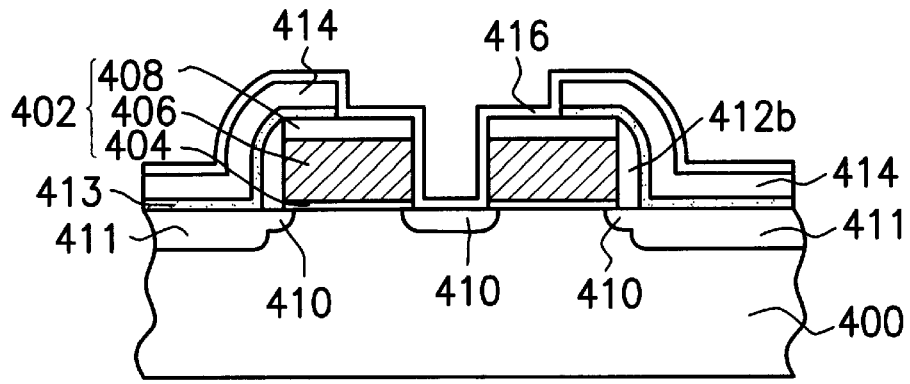

Referring next to FIG. 4D, the dielectric layer 413 is patterned by anisotropic etching, using the dielectric layer 414 as a mask, to expose the source/drain region 410. The spacer 412a between two gates 402 is also removed by etching. A dielectric layer 416 is formed on the dielectric layer 414 and the source/drain region 410 between two gates 402 by chemical vapor deposition (CVD). The dielectric layer 416 includes silicon oxide or silicon nitride and is about 200–300 Å thick.

Figure 4E:
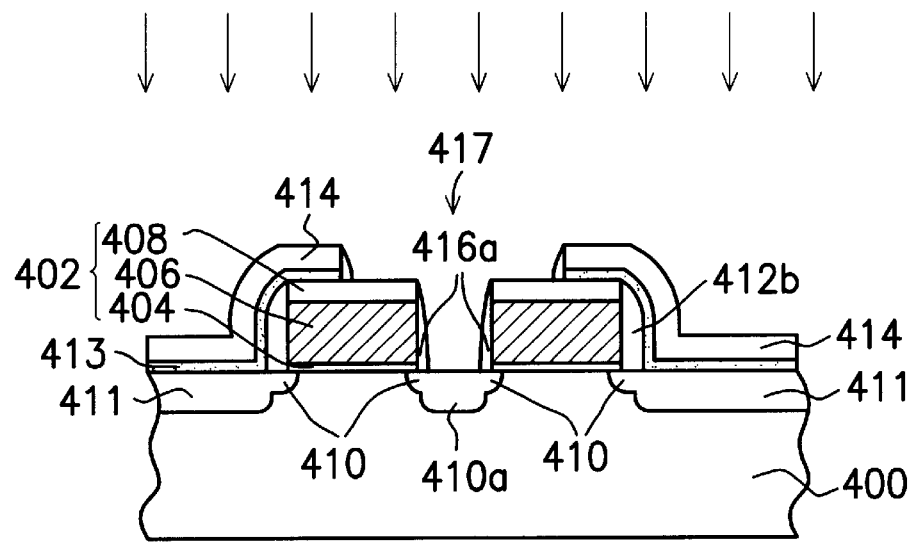

Referring next to FIG. 4E, an anisotropic etching is performed on the dielectric layer 416 to form a spacer 416a on the sidewalls of the gates 402 and to form a self-aligncontact opening 417 located between two gates 402. Because the dielectric layer 416 is very thin, the width of the spacer 416a is narrower than the width of the spacer 412b. Therefore, the exposed area of the source/drain regions 410 between two gates 402 increases, thus also increasing the contact area of the self-align-contact with the source/drain regions 410 increases.

Figure 4F:
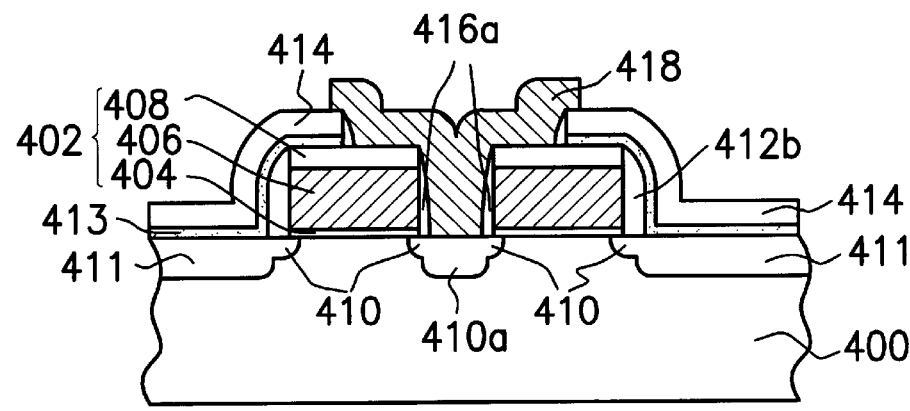

Referring next to FIG. 4F, a conductive layer 418 is formed to a thickness of about 1000–3000 Å. The conductive layer 418 is formed by depositing a polysilicon layer, implanting phosphorus or arsenic ions into the polysilicon layer and annealing the polysilicon layer. The implanting step can be performed either with or after the depositing step. The conductive layer 418 is patterned by lithography and an etching process. A self-align-contact of the invention is accomplished.

The self-align-contact of the invention has the following characteristics:

1. The self-align-contact of the invention includes the spacer 316a with a narrow width to increase the ohmic contact between the self-align-contact and the source/drain regions 310 and to reduce the resistance of the self-align-contact.

2. The self-align-contact of the invention includes the spacer 316a with a narrow width to increase the exposed area of the source/drain regions 310 and to increase the integration of semiconductor devices.

3. The self-align-contact of the invention can eliminate connection of the adjacent spacers' and device failure.

While the invention has been described by way of example and in terms of preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications, similar arrangements and procedures.

What is claimed is:

1. A method of fabricating a self-aligned-contact, wherein a gate and a spacer are set on a source/drain region on a semiconductor substrate, said method comprising the steps of:

forming a first dielectric layer and a second dielectric layer on the gate, the source/drain region, the first spacer, and the semiconductor substrate;

patterning the second dielectric layer using the first dielectric layer as a stop layer;

removing part of the first dielectric layer and the first spacer using the second dielectric layer as a mask to form a self-align-contact opening exposing the source/drain region a sidewall of the gate;

forming a second spacer on the exposed sidewall of the gate, wherein the width of the second spacer is narrower than the width of the first spacer; and forming a conductive layer in the self-align-contact opening.

2. A method as claimed in claim 1, wherein the source/drain region is a lightly doped drain (LDD) structure.

3. A method as claimed in claim 1, wherein the first dielectric layer includes silicon oxide.

4. A method as claimed in claim 1, wherein the first dielectric layer includes silicon nitride.

5. A method as claimed in claim 1, wherein the first dielectric layer is about 200–300 Å thick.

6. A method as claimed in claim 1, wherein the etching rate of the first dielectric layer and the etching rate of the first spacer layer are approximately the same.

7. A method as claimed in claim 1, wherein the etching rate of the first dielectric layer and the etching rate of the second dielectric layer are different.

8. A method as claimed in claim 1, wherein the first dielectric layer is silicon oxide, the second dielectric layer is silicon nitride and the first spacer.

9. A method as claimed in claim 1, wherein the method of removing the first dielectric layer and the first spacer includes etching.

10. A method as claimed in claim 1, wherein the method of forming the second spacer includes forming an insulating layer and anisotropically etching the insulating layer.

11. A method as claimed in claim 10, wherein the insulating layer is about 200–300 Å thick.

12. A method as claimed in claim 1, wherein the conductive layer includes doped polysilicon.

13. A method of fabricating a self-align-contact, wherein two gates and a first spacer on a sidewall of each gate are set on a semiconductor substrate, and a source/drain region between the two gates semiconductor substrate, said method comprising the steps of:

forming a first dielectric layer and a second dielectric layer on the gate, the source/drain region, the first spacer, and the semiconductor substrate;

patterning the second dielectric layer using the first dielectric layer as a stop layer;

etching the first dielectric layer and the first spacer, using the second dielectric layer as a mask, to form a self-align-contact opening between the two gates to expose the source/drain region and to expose sidewalls of the two gates;

forming a second spacer on the exposed sidewalls of the two gates, wherein the width of the second spacer is narrower than the width of the first spacer; and forming a conductive layer in the self-align-contact opening.

14. A method as claimed in claim 13, wherein the source/drain region is a lightly doped drain (LDD) structure.

15. A method as claimed in claim 13, wherein the first dielectric layer includes silicon oxide.

16. A method as claimed in claim 13, wherein the first dielectric layer includes silicon nitride.

17. A method as claimed in claim 13, wherein the etching rate of the first dielectric layer and the etching rate of the first spacer layer are approximately the same.

18. A method as claimed in claim 13, wherein the etching rate of the first dielectric layer and the etching rate of the second dielectric layer are different.

19. A method as claimed in claim 13, wherein the first dielectric layer is silicon oxide, the second dielectric layer is silicon nitride and the first spacer is silicon oxide.

20. A method as claimed in claim 13, wherein the method of forming the second spacer includes forming an insulating layer and anisotropically etching the insulating layer.

21. A method as claimed in claim 13, wherein the insulating layer is about 200–300 Å thick.

22. A method as claimed in claim 13, wherein the conductive layer includes doped polysilicon.

* * * * *